(12) United States Patent
Fuchs et al.

(10) Patent No.: US 8,412,432 B2
(45) Date of Patent: Apr. 2, 2013

(54) PROTECTIVE ARRANGEMENT FOR THE PROTECTION OF SAFETY-RELEVANT ELECTRONIC CIRCUITS FROM MALFUNCTIONS

(75) Inventors: Matthias Fuchs, Velbert (DE); Marco Junglas, Koblenz (DE); Lutz Muders, Oberheimbach (DE); Benedikt Ohlig, Vallendar (DE)

(73) Assignee: Lucas Automotive GmbH, Koblenz (DE)

( * ) Notice: Subject to any disclaimer, the term of this patent is extended or adjusted under 35 U.S.C. 154(b) by 51 days.

(21) Appl. No.: 12/988,160

(22) PCT Filed: Apr. 15, 2009

(86) PCT No.: PCT/EP2009/002765
§ 371 (c)(1),
(2), (4) Date: Dec. 9, 2010

(87) PCT Pub. No.: WO2009/127409
PCT Pub. Date: Oct. 22, 2009

(65) Prior Publication Data
US 2011/0098899 A1    Apr. 28, 2011

(30) Foreign Application Priority Data
Apr. 18, 2008  (DE) .................. 10 2008 019 673

(51) Int. Cl.
*B60T 13/74* (2006.01)
*H02H 3/00* (2006.01)
(52) U.S. Cl. ............ 701/70; 336/200; 361/30; 361/31; 361/33; 318/782
(58) Field of Classification Search .............. 701/70; 361/88, 30, 31, 33; 318/782; *B60T 13/74; H02H 3/00*
See application file for complete search history.

(56) References Cited

U.S. PATENT DOCUMENTS

| 5,408,150 | A | * | 4/1995 | Wilcox ................... 327/108 |
| 6,288,906 | B1 | * | 9/2001 | Sprietsma et al. ........... 361/772 |
| 6,325,466 | B1 | | 12/2001 | Robertson et al. |
| 6,489,758 | B2 | * | 12/2002 | Moriconi et al. ............ 323/288 |

(Continued)

FOREIGN PATENT DOCUMENTS

| DE | 92489 | 9/1972 |
| DE | 19838886 A1 | 10/1999 |
| DE | 19854914 A1 | 6/2000 |
| DE | 102004012102 B3 | 11/2005 |

(Continued)

*Primary Examiner* — James Trammell
*Assistant Examiner* — Todd Melton
(74) *Attorney, Agent, or Firm* — MacMillan, Sobanski & Todd, LLC (57) ABSTRACT

A protective circuit arranged on a Printed Circuit Board (PCB) has two conductor loops. At least one supply voltage track, at least one semiconductor switch and at least one control component are arranged on the PCB. A first terminal of the control component and a first terminal of the semiconductor switch are connected electrically. A first conductor loop of the protective circuit is arranged on the PCB so that it surrounds an electrically conducting connection between the supply voltage track and the semiconductor switch and/or the control component. A second conductor loop is arranged on the PCB so that it surrounds the electrically conducting connection between the first terminal of the control component and the first terminal of the semiconductor switch, and thereby screens the same from the semiconductor switch and at least from those regions of the control component that are also connected to the supply voltage track.

26 Claims, 4 Drawing Sheets

| U.S. PATENT DOCUMENTS | | | |
|---|---|---|---|
| 6,828,894 B1 * | 12/2004 | Sorger et al. | 336/200 |
| 7,154,278 B2 | 12/2006 | Scholl et al. | |
| 7,233,224 B2 * | 6/2007 | Strzalkowski et al. | 336/200 |
| 2006/0163941 A1 * | 7/2006 | Von Hayn et al. | 303/155 |
| 2006/0267559 A1 * | 11/2006 | Ueda | 322/89 |
| 2008/0105502 A1 | 5/2008 | Koth et al. | |

| FOREIGN PATENT DOCUMENTS | | |
|---|---|---|
| DE | 102004059546 A1 | 6/2006 |
| EP | 1574869 A1 | 9/2005 |
| JP | 198291 A | 4/1989 |
| JP | 7321427 A | 12/1995 |

* cited by examiner

PROTECTIVE ARRANGEMENT FOR THE PROTECTION OF SAFETY-RELEVANT ELECTRONIC CIRCUITS FROM MALFUNCTIONS

CROSS-REFERENCE TO RELATED APPLICATIONS

This application is a national stage of International Application No. PCT/EP2009/002765 filed Apr. 15, 2009, the disclosures of which are incorporated herein by reference, and which claimed priority to German Patent Application No. 10 2008 019 673.8 filed Apr. 18, 2008, the disclosures of which are incorporated herein by reference.

BACKGROUND OF THE INVENTION

Printed circuit boards or multilayer circuit boards (which comprise several printed circuit boards in layers) are used in many electronic devices. A printed circuit board is a support made of insulating material with adherent conducting connections. It is used for the mechanical fixing and electrical connection of electronic circuit components and parts. Integrated circuits can be placed directly on or in the printed circuit board. In a multilayer circuit board, such printed circuit boards are connected to each other electrically and/or mechanically.

Short-circuits on such printed circuit boards or in a multilayer circuit board may lead to malfunctions. For example, short-circuits caused by moisture penetrating the housing of the electronic circuit, may result in the unintended activation of an electrically controlled component. This problem is becoming apparent more frequently in view of the increasing electronification of motor vehicles. One example of this is an electronic parking brake, in which the relevant control electronics are arranged in or on the actuator.

Voltage-controlled components are found to be highly sensitive to short-circuits with a corresponding operating potential. For example, if a short-circuit occurs in a circuit for controlling an electronic parking brake (EPB) in a land vehicle, wherein said short-circuit has an operating potential which corresponds to that of the EPB, the EPB is unintentionally activated. This could be particularly critical to safety if the brake is released while in parked mode or applied while the vehicle is being driven.

A known method of detecting a short-circuit on a printed circuit board is for active protective circuits to be mounted on the printed circuit board for regions with supply voltage potential. An active protective circuit includes an electronic evaluation unit, which monitors parameters such as voltage, current and temperature, for example. Circuit components, parts and groups arranged on the printed circuit board are then brought to a safe state depending on the measurements of the electronic evaluation unit. This may prevent a malfunction or an unintended activation of, or damage to, downstream components by a short-circuit current, which is usually significantly higher than the operating current.

DE 198 54 914 A1 describes a method and a circuit arrangement for detecting a fault, in particular a short-circuit, in the load circuit of a controlled power switch. The start of regulation of the load current limitation in the controlled power switch is used as a measure for a short-circuit.

However, if a number of short-circuits occur in parallel, the protection facilities described therein do not provide adequate protection.

BRIEF SUMMARY OF THE INVENTION

The present invention is directed toward a protective arrangement for the protection of safety-relevant electronic circuits from malfunctions is described below. It is based on the self-monitoring principle and facilitates the continuous monitoring of important operating parameters, such as—for example—voltage in the electronic circuit, thus enabling impending faults to be detected at an early stage. By using protective elements for the early detection of short-circuits between tracks on a printed circuit board, critical effects of such short-circuits are prevented wherein the protective elements are to be implemented directly on the printed circuit board.

On the basis of the above-stated problem, a protective arrangement is to be specified that is simple and cost-effective to implement.

The protective circuit specified in claim 1 may be used as a solution to this problem. It is arranged on a printed circuit board, on which at least one supply voltage track, at least one semiconductor switch and at least one control component are arranged. The semiconductor switch and the control component each have at least one terminal, with a first terminal of the control component and a first terminal of the semiconductor switch being connected electrically. A first conductor loop is arranged on the printed circuit board so that it surrounds electrically conducting connections between the supply voltage track and the semiconductor switch and/or the control component. This first conductor loop is connected to at least one electronic evaluation unit, which is designed for monitoring the voltage potential applied to the first conductor loop or for measuring the current flowing in the first conductor loop.

The electronic evaluation unit may be manufactured as a discrete detector circuit, or even as a microprocessor or application-specific integrated circuit (ASIC).

The first conductor loop, with associated electronic evaluation unit, is used for detecting potential short-circuits between the supply voltage track and other tracks on the printed circuit board, such as occur—for example—as a result of liquids or foreign objects.

The first conductor loop has a predefined voltage potential that does not exceed the supply voltage potential, or earth potential.

A short-circuit potential is significantly higher than the supply voltage potential. If a connecting cable that is surrounded by the first conductor loop has short-circuit potential, it transfers it to the first conductor loop. The electronic evaluation unit measures the significant increase in potential on the first conductor loop and thus detects the short-circuit.

If an incorrect voltage or a fault current is detected, which indicates the occurrence of one or more short-circuits, a corresponding error message may be sent to the user and the circuit on the printed circuit board may be brought to a safe state. The circuit surrounded by the first conductor loop may, for example, be permanently deactivated.

Various methods or combinations thereof may be used for this purpose.

A protective element and/or a trace narrowing may be provided in a safety-critical conducting path on the printed circuit board. In the event of a short-circuit, this ensures that the regions of the printed circuit board which have short-circuit potential are delimited.

Semiconductor switches, such as a processor or an application-specific integrated circuit (ASIC), which may be arranged on the printed circuit board, have an integrated semiconductor structure which is destroyed in a controlled manner in the event of a short-circuit. This also ensures that regions of the printed circuit board which have short-circuit potential are delimited in the event of a short-circuit.

In a processor, which may be included in the printed circuit board, a flash cell included in the processor is written to in the event of a short-circuit. This likewise causes the circuit parts, components or groups affected by the short-circuit to be deactivated.

The claimed protective circuit includes a second conductor loop, which is arranged on the printed circuit board so that it screens the electrically conducting connection between the first terminal of the control component and the first terminal of the semiconductor switch from the semiconductor switch, the supply voltage track and at least from those regions of the control component which are also connected to the supply voltage track.

This second conductor loop is not monitored by an electronic evaluation unit.

The second conductor loop is at a predefined potential, which is selected such that it leads to a non-critical state in the event of one or more short-circuits with the surrounded circuit. The second conductor loop may be potential-free.

The first terminal of the semiconductor switch is completely surrounded by the second conductor loop. This ensures that, in the event of one or more short-circuits with the circuit surrounded by the second conductor loop, the high short-circuit potential present on the first terminal of the semiconductor switch is reduced by a defined amount by the second conductor loop. This takes place as a result of the second conductor loop being so resistive that, once a defined threshold on the first terminal of the semiconductor switch is exceeded, it withdraws power from the same and reduces the potential present on the semiconductor switch by a defined amount.

This provides passive protection against a breakdown in the activation of the semiconductor switch, thus preventing the unintentional activation of a component connected downstream from the semiconductor switch. Such a downstream component may, for example, be an electronic parking brake in a land vehicle.

A defined operating potential of the downstream component is significantly lower than the short-circuit potential. The two conductor loops therefore permit the control of the downstream component and do not specifically reduce the control potential or report a short-circuit.

Such conductor loops are preferably arranged around regions with supply voltage potential and/or around critical circuit parts, components or groups.

The semiconductor switch and the control component each have a second terminal. The second terminal of the semiconductor switch and the second terminal of the control component are connected electrically to the supply voltage track. The first conductor loop surrounds the electrically conducting connections between the supply voltage track and the semiconductor switch and/or the control component. This second terminal of the control component is arranged on the control component so that its distance from the supply voltage track is as small as possible.

Furthermore, the control component has a third and a fourth terminal. The third and the fourth terminal of the control component have an earth potential.

The first terminal of the control component is arranged between the third and the fourth terminal of the control component.

A start of the second conductor loop is connected electrically to the third terminal of the control component. An end of the second conductor loop is connected electrically to the fourth terminal of the control component.

This arrangement of the second conductor loop means that it is arranged as a closed second conductor loop. It screens the electrically conducting connection between the first terminal of the control component and the first terminal of the semiconductor switch from the semiconductor switch, and at least from those regions of the control component which are connected to the supply voltage track.

Moreover, the threshold voltage of the at least one semiconductor switch is selected at a sufficiently high level so that the voltage applied to a downstream component in the event of a short-circuit between two feed lines of the semiconductor switch is insufficient to operate and/or damage the component.

It is additionally advantageous for the operating voltage range of a downstream component to be toleranced as tightly as possible.

It is also advantageous if the first and the second conductor loop, at least in sections, are bare and not covered with solder resist lacquer or other insulation.

In a special embodiment, the semiconductor switch is a transistor and the first terminal of the semiconductor switch is a gate terminal.

In this embodiment, at least one diode in the electrical connection is arranged between the first terminal of the control component and the gate terminal of the transistor, and/or at least one voltage divider is provided in the transistor. This causes the threshold voltage of the transistor to be increased to a sufficient level and the effects of short-circuits thereby to be reduced.

The at least one diode and the at least one voltage divider may be integrated in the transistor, in order to minimize the effects of external disturbances.

The higher the selected threshold voltage of the transistor, the lower the voltage applied to a downstream motor is in the event of a short-circuit. This voltage applied to the motor is lower than the operating voltage of the motor.

The transistor has a third terminal which is a source terminal.

In the described embodiment the gate terminal of the transistor and the first terminal of the control component are connected electrically. Moreover, the source terminal of the transistor is connected electrically to this electrically conducting connection.

This electrically conducting connection between the source terminal of the transistor and the electrically conducting connection between the gate terminal of the transistor and the first terminal of the control component include at least one discharge resistor.

The introduction of a discharge resistor or of a power source at a non-critical potential, which may likewise be included in the electrically conducting connection, causes a power-free voltage control to be converted to a powered control.

The electrically conducting connection between the gate terminal of the transistor and the first terminal of the control component may likewise include at least one discharge resistor.

In an alternative embodiment, at least two transistors are included on the printed circuit board. An electrically conducting coupling is provided between two electrically conducting connections, each of which is formed between a gate terminal of a transistor and a terminal of the control component. This electrically conducting coupling includes at least one coupling resistor.

The at least one electrically conducting coupling ensures that, if one of the at least two transistors is incorrectly activated, the other transistor is also automatically activated. This reduces the difference in voltage in the circuit, which is a measure for the critical effect of short-circuits.

The coupling resistor is selected so that current only flows through the coupling when the voltage applied to it is significantly higher than the operating voltage. Therefore, if no faults are present, only the transistor in which the activation is intentional is activated. Only in the event of a short-circuit are both transistors activated.

In this alternative embodiment the second conduction loop completely surrounds the electrically conducting connections which are formed between a gate terminal of a transistor and a terminal of the control component, thereby completely enclosing the two gate terminals.

Function and effect of the second conductor loop in this exemplary embodiment is analogous to the function and effect of the second conductor loop for only one surrounded gate terminal.

Furthermore, a passive protective surface is defined between two printed circuit boards of a multilayer circuit board, said multilayer circuit board comprising at least two printed circuit boards. A previously described protective circuit is arranged on each of the included printed circuit boards. In addition, circuit parts, components or groups are arranged on each of the printed circuit boards; for example those that are already mentioned for the printed circuit board described at the beginning.

A first of the at least two printed circuit boards is arranged over a second printed circuit board and the first and second printed circuit boards are connected to each other mechanically and/or electrically.

The passive protective surface includes a conductor surface, which is arranged between the first and second printed circuit board. This conductor surface surrounds the electrically conducting connections between the first and the second printed circuit board.

The conductor surface is at a predefined potential. The conductor surface may have earth potential.

This conductor surface is not monitored by an electronic evaluation unit.

The conductor surface is arranged so that, in the event of a short-circuit on one of the printed circuit boards included in the multilayer circuit board, two printed circuit boards included in the multilayer circuit board are brought to a non-critical state.

In the event of one or more short-circuits on one of the two printed circuit boards, the conductor surface screens the two printed circuit boards almost completely from one another, so that the high short-circuit potential on the faulty printed circuit board does not cut across to the fault-free printed circuit board, but is reduced by a defined amount by the conductor surface. This takes place as a result of the conductor surface being so resistive that it withdraws power once a defined limit potential of a connection between the first and the second printed circuit board is exceeded, thus reducing the short-circuit potential of said connection by a defined amount.

This provides passive protection against a breakdown of the short-circuit potential of the faulty printed circuit board to the fault-free printed circuit board.

Moreover, an electronic system is defined for operating an electromechanical parking brake system of a vehicle, which includes at least one protective circuit as described above.

The electronic system may have at least one input unit for capturing a driver's wish. This driver's wish may be evaluated by a control unit. The control unit may control at least one positioning unit to actuate at least one brake. This positioning unit may include at least two control components. A first control component may be assigned to the input unit and at least one second control component may be assigned to the at least one positioning unit.

The first control component and the at least one second control component may be in a master-slave relationship to one another and the at least one second control component, which is assigned to the at least one positioning unit, may include controlled power switches necessary for controlling the positioning unit, such as transistors, for example.

The first control component, which is assigned to the input unit, may evaluate the driver's wish and define the corresponding activation (e.g. apply or release) of at least one positioning unit. It may be provided locally in the region of the input unit.

The control components may communicate with one another via at least one bus system. They may likewise communicate with one another via a redundantly designed communication system.

The second control component assigned to the positioning unit may communicate with one or more further system units. This enables an additional system unit to be assigned to an automatic transmission system. The additional system unit that is assigned to the automatic transmission system expediently enables the parking brake system to be automatically locked in a transmission setting assigned to the "Park" state.

The protective circuit described above may be included in at least one of the control components.

In addition, the at least one second control component may be integrated in the at least one positioning unit and include at least one protective circuit.

Furthermore, an electronic system for operating an electromechanical parking brake system of a vehicle is defined, which includes at least one protective surface as defined above.

This at least one protective surface may be included in at least of the control components.

In addition the at least one second control component may be integrated in the at least one positioning unit and include at least one protective surface.

Other advantages of this invention will become apparent to those skilled in the art from the following detailed description of the preferred embodiments, when read in light of the accompanying drawings.

DETAILED DESCRIPTION OF THE INVENTION

The transistors described below are, in particular, n-channel high-side field-effect transistors. Field-effect transistors, because of their large input resistor, permit power-free control of a current by a voltage. Consequently, the control of a component which is controlled by one of the transistors described below is generally power-free. However, other semiconductor switches may be protected with the proposed protective arrangement.

Figure 1:
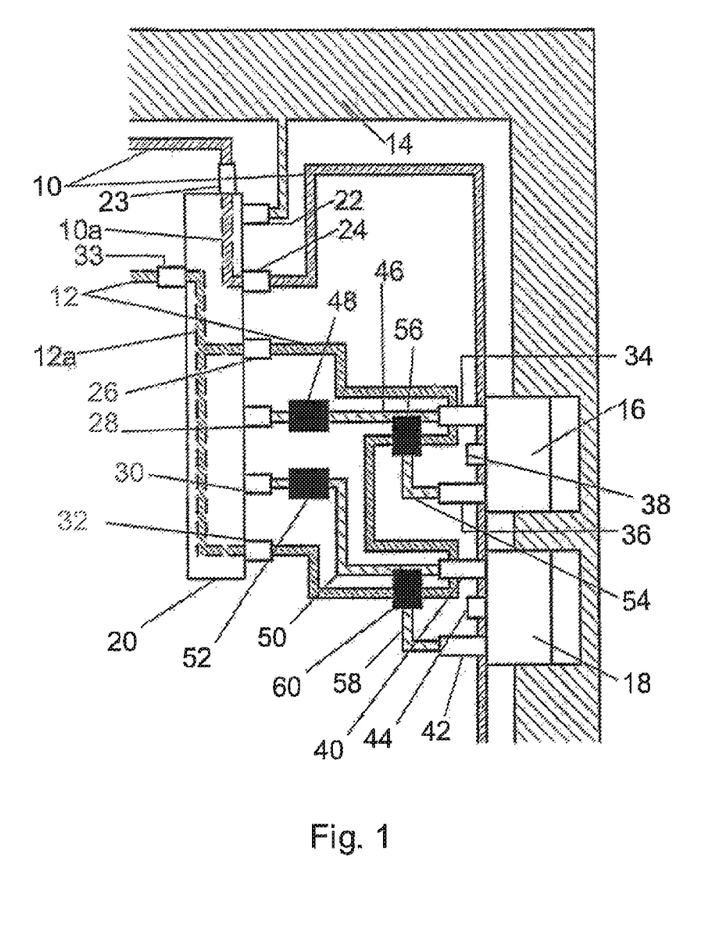
FIG. 1 shows a section of a printed circuit board on which is included a protective circuit in accordance with claim 1.

FIG. 1 shows a section of a printed circuit board on which a passive protective circuit is arranged. It includes two conductor loops 10, 12. Both conductor loops 10, 12 have an earth potential.

A section of a supply voltage track 14, two transistors 16, 18 and a driver module 20, are also arranged on the section of the printed circuit board.

Eight terminals of the driver module 20 are relevant for the embodiment described below; a supply voltage terminal 22, two conductor loop terminals 23, 24 for the first conductor loop 10, three earth terminals 26, 32, 33 for the second conductor loop 12 and two connecting terminals 28, 30 with supply voltage potential.

The supply voltage terminal 22 is conductively connected to the supply voltage track 14.

A first conductor loop 10 is connected to the driver module 20 by means of the conductor loop terminal 23. In the driver module 20 a section 10a of the first conductor loop 10 forms a connection between the conductor loop terminal 23 and the conductor loop terminal 24. The first conductor loop 10 exits the driver module 20 through the conductor loop terminal 24.

Before the first conductor loop 10 enters the driver module 20 through the conductor loop 23 and after it exits the driver module 20 through the conductor loop terminal 24, it runs closely alongside the supply voltage track 14 at a predefined distance.

The two transistors 16, 18 each have three terminals, a gate terminal 34, 40, a source terminal 36, 42 and a drain terminal 38, 44. They are arranged on the section of the printed circuit board shown in FIG. 1 so that the source terminal 36, 42 and the drain terminal 38, 44 are each connected electrically to the section of the supply voltage track 14 (connection not shown).

For this purpose the first transistor 16 is arranged with its right-hand section in FIG. 1 on the section of the supply voltage track 14. A left-hand section of the transistor 16 in FIG. 1 has, in a way that is externally visible, the gate terminal 34, the source terminal 36 and the drain terminal 38, and points away from the supply voltage track in the direction of the driver module 20.

A second transistor 18 is shown in FIG. 1 below the first transistor 16 and is constructed and arranged at a distance from it and analogously to it.

The connection terminal 28 of the driver module 20 is connected electrically to the gate terminal 34 of the first transistor 16. This electrically conducting connection 46 includes a resistor 48 which acts as a discharge resistor. It ensures the powered control of the first transistor 16.

Analogously to this, the connection terminal 30 of the driver module 20 is electrically connected to the gate terminal 40 of the second transistor 18. This electrically conducting connection 50 likewise includes a resistor 52, which acts as a discharge resistor and which ensures the powered control of the second transistor 18.

Moreover, the source terminal 36 of the first transistor 16 is electrically connected to the electrically conducting connection 46. This connection 54 also includes a resistor 56 which acts as a discharge resistor.

The source terminal 42 of the second transistor 18 is also analogously connected electrically to the electrically conducting connection 50. This connection 58 likewise includes a resistor 60 which acts as a discharge resistor.

The first conductor loop 10, which runs at a predefined distance from the supply voltage track 14, surrounds each of the gate, source and drain terminals 34, 36, 38, 40, 42, 44 of the two transistors 16, 18.

Moreover, a partial section of the section 10a of the first conductor loop 10, which runs inside the driver module 20, surrounds the electrically conducting connection of the driver module 20 to the supply voltage track 14 (not shown). This enters the driver module 20 through the supply voltage terminal 22 and, in this embodiment, supplies the connecting terminals 28, 30 with supply voltage.

It is necessary to ensure that the first conductor loop 10 surrounds all electrical connecting cables via which the circuit parts, components or groups on the printed circuit board are fed with supply voltage.

An electronic evaluation unit (not shown) is connected to this first conductor loop 10. This is used for monitoring the voltage potential on the first conductor loop 10.

The first conductor loop 10 has a predefined voltage potential, which preferably does not exceed the supply voltage potential. It may have earth potential. Moreover, the first conductor loop 10 has a predefined limit potential.

The predefined limit potential is significantly higher than the supply voltage potential and is exceeded when short-circuits occur with the supply voltage track 14.

If this limit potential is exceeded by the potential present on the electrical connecting cables via which circuit parts, components or groups on the printed circuit board are fed with supply voltage, and which are surrounded by the first conductor loop 10, this event is detected by the electronic evaluation unit. On the basis of this detection, the circuit on the printed circuit board is brought to a safe state. This occurs, for example, as a result of the permanent deactivation of regions of the printed circuit board which are affected by a short-circuit.

In addition to the first conductor loop 10, a second conductor loop 12 is provided on the section of the printed circuit board shown in FIG. 1. This is connected to the driver module 20 by means of the earth terminal 33. A section 12a of the second conductor loop 12, which runs inside the driver module 20, branches off and forms a connection to each of the earth terminals 26 and 32 of the driver module 20.

The second conductor loop 12 exits the driver module 20 through the earth terminal 26 and re-enters the driver module 20 through the earth terminal 32.

In a section of the second conductor loop 12 outside the driver module 20, between its earth terminals 26, 32, the second conductor loop 12 surrounds the gate terminal 34 of the first transistor 16 and the gate terminal 40 of the second transistor 18.

On the section of the printed circuit board shown in FIG. 1, this course of the second conductor loop 12 causes the two electrically conducting connections 46, 50 to be screened against the two transistors 16, 18, the supply voltage track 14 and the regions of the driver module 20 which are also in connection with the supply voltage track 14.

The second conductor loop 12 has earth potential in this embodiment. It may also have a predefined voltage potential which does not exceed the supply voltage potential. Moreover, the first conductor loop 12 has a predefined limit potential. It is resistive such that current only flows into it after voltage is applied that is significantly higher than the operating voltage.

The predefined limit potential is significantly higher than the supply voltage potential. This limit potential is exceeded if a short-circuit occurs between the electrical connecting cables 46, 50.

In this case the second conductor loop 12, which surrounds the gate terminals 34, 40, withdraws this current and thus reduces the potential by a defined amount.

Figure 2:
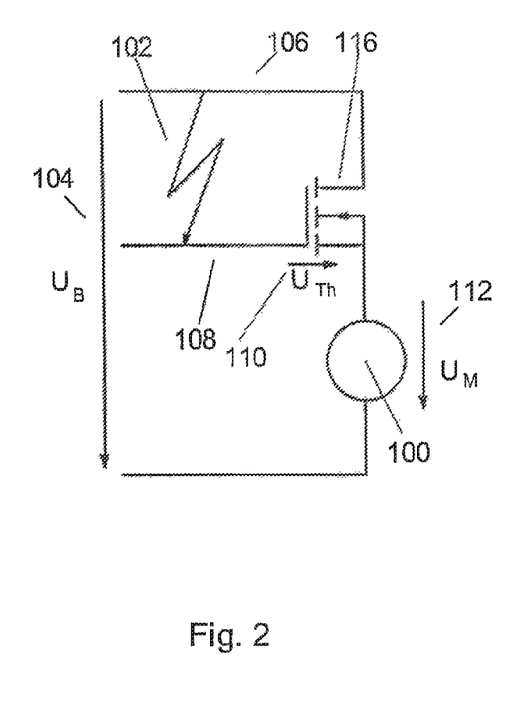
FIG. 2 shows a circuit diagram in which a motor is controlled by a transistor and an unwanted short-circuit is present between a gate line and a drain line of the transistor.

FIG. 2 shows a circuit diagram in which a motor 100 is controlled by a transistor 116 and in which a short-circuit 102 is present between a drain line 106 and a gate line 108 of the transistor 116.

The circuit shown in FIG. 2 is supplied with operating voltage $U_B$ 104 by a voltage source (not shown).

The transistor 116 has an adjustable or manufacturer-defined threshold voltage $U_{Th}$ 110.

As a result of the short-circuit 102, the voltage $U_M$ 112 applied to the motor 100 is equal to the difference between operating voltage $U_B$ 104 and threshold voltage $U_{Th}$ 110 of the transistor 116.

The higher the threshold voltage $U_{Th}$ 110 of the transistor 116, the lower the voltage $U_M$ 112 is that is applied to the motor 100.

The threshold voltage $U_{Th}$ of the transistor 116 is so high that, in the event of a short-circuit 102, the voltage $U_M$ 112 applied to the motor 100 is sufficiently below the operating voltage $U_B$ of the motor 100. This prevents any unintentional activation of the motor 100.

Figure 3:
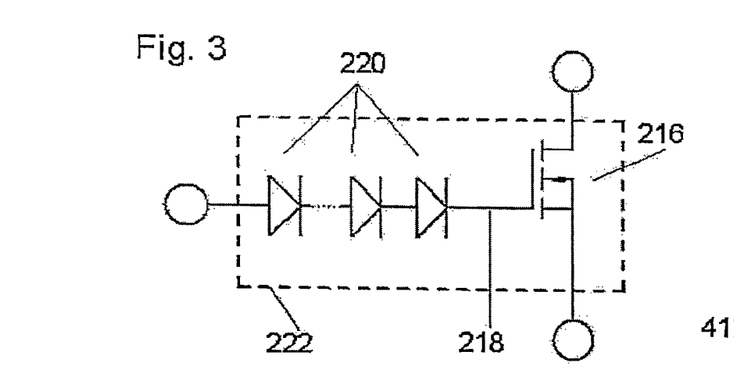
FIG. 3 shows a circuit diagram of an advantageous embodiment of a transistor from FIGS. 1 and 2.

FIG. 3 shows a circuit diagram of an advantageous embodiment of a transistor included in FIGS. 1 and 2.

A transistor 216 shown in FIG. 3 has one or more diodes 220 connected in series (in a forward direction) in its gate line 218. These enable the threshold voltage of the transistor 216 to be increased, by causing a defined reduction in voltage in the gate line 218.

The more diodes 220 that are included in the gate line 218, the higher is the threshold voltage of the transistor 116.

To minimize the effects of external disturbances, these diodes 220 are integrated in the transistor housing 222.

Figure 4:
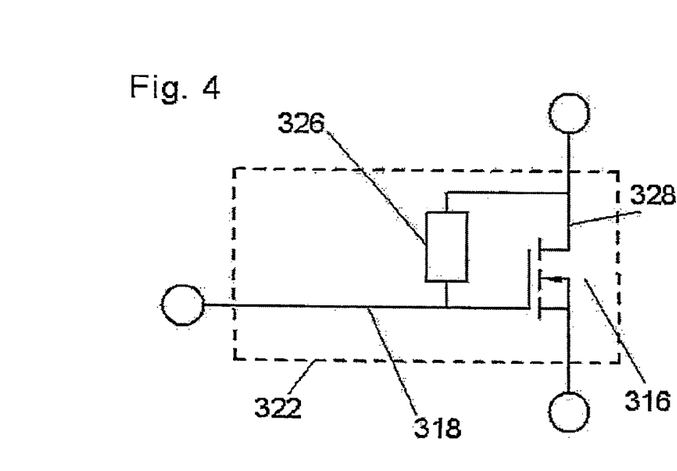
FIG. 4 shows a circuit diagram of an alternative, advantageous embodiment of a transistor from FIGS. 1 and 2.

FIG. 4 shows a circuit diagram of an alternative advantageous embodiment of a transistor contained in FIGS. 1 and 2.

A transistor 316 shown in FIG. 4 contains a voltage divider.

The voltage divider is formed by a resistor 326 arranged between the gate line 318 and the drain line 328 of the transistor 316.

With this arrangement a part of the output voltage of the transistor 316 is added to the input voltage of the transistor 316 via the resistor 326. Since the circuit shown is an inverting amplifier, the input voltage of the transistor 316 is reduced by the voltage divider.

To minimize the effects of external disturbances, the voltage divider arrangement is also integrated in the transistor housing 322.

Figure 5:
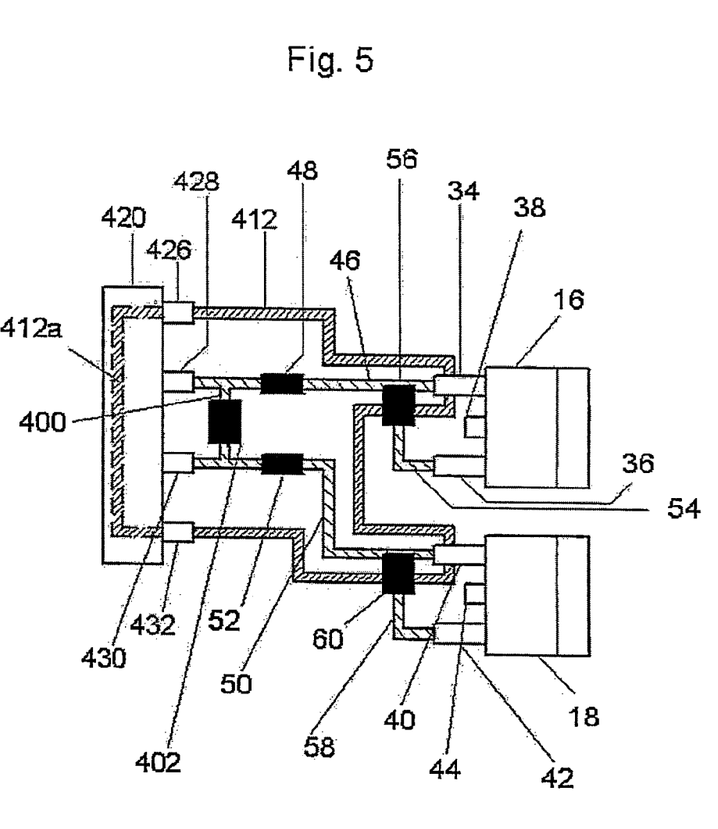
FIG. 5 shows an alternative arrangement of a section from FIG. 1.

FIG. 5 shows an alternative arrangement of a section from FIG. 1, on which only the second of the two conductor loops 10, 12 is shown.

The arrangement in FIG. 5 is identical to that shown in FIG. 1, with very few exceptions.

The supply voltage track and the first conductor loop are missing in FIG. 5. Only two earth terminals 426, 432 and two connecting terminals 428, 430 of the driver module 420 are relevant for the embodiment described below. These correspond to the earth terminals 26, 32 and the connecting terminals 28, 30 from FIG. 1.

The second conductor loop 412, as in FIG. 1, has a section 412a, which runs in the driver module 420. However, this section 412a forms only one electrically conducting connection between the two terminals 426 and 432 within the driver module 420.

Also in FIG. 5, the second conductor loop 412 has a predefined voltage potential which does not exceed the supply voltage potential. It may have earth potential. Moreover, it has a predefined limit potential.

The electrically conducting connections 46, 50 between the transistors 16, 18 and the connecting terminals 428, 430 of the driver module 420 are analogous to those described with reference to FIG. 1. The only exception is formed by a coupling 400 between the electrically conducting connections 46 and 50. The coupling 400 is formed by an electrically conducting connection between the two electrically conducting connections 46 and 50, directly after the connecting terminals 428, 230 and before the discharge resistors 48, 52. This electrically conducting connection includes a coupling resistor 402.

The coupling resistor 402 of this coupling 400 is selected so that, in the event of unintentional activation—i.e. if a short-circuit occurs, both transistors 16, 18 are activated. This reduces the difference in voltage in the circuit, which is a measure for the critical effect of a short-circuit.

However, of the two transistors 16 and 18, only the one in which the activation is intentional is activated if there is no short-circuit present.

In the arrangement shown in FIG. 5, the second conductor loop 412 has the same function as already described for the arrangement in FIG. 1.

Figure 6:
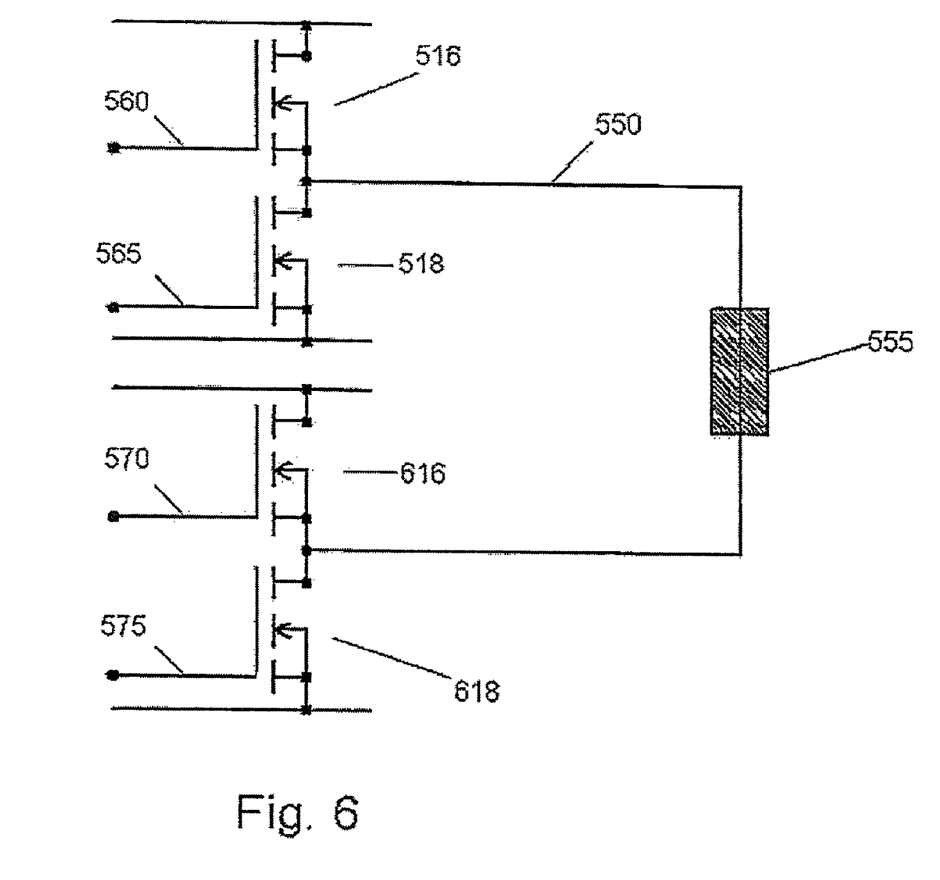
FIG. 6 shows an H-bridge circuit of four transistors for controlling a motor.

FIG. 6 shows an H-bridge circuit of four transistors 516, 518, 616, 618 for controlling a motor.

In the H-bridge circuit, a source terminal 536 of the first transistor 516 and a drain terminal 544 of the second transistor 518 are connected electrically. A source terminal 636 of the third transistor 616 and a drain terminal 644 of the fourth transistor 618 are likewise connected electrically.

A further electrically conducting connection 550 is formed between these two connections. This forms windings of a coil 555 of an electric motor in one section.

The transistor 516 may correspond to the transistor 16 from FIG. 1 and the transistor 518 may correspond to the transistor 18 from FIG. 1. The embodiment from FIG. 1 therefore is one half of an H-bridge circuit.

As described with reference to FIGS. 3 and 4, the four transistors 516, 518, 616, 618 have one or more diodes (in a forward direction) or a voltage divider (not shown here) in their gate lines 560, 565, 570, 575.

The motor may be rotationally operated in two directions by means of the four transistors 516, 518, 616, 618.

If operating voltage is applied to the gate lines 560, 575 of the first and the fourth transistor 516, 618, a directed current flows in the electrically conducting connection 550. This directed current flows through the windings of the coil 555 of the motor. The motor consequently operates in a first direction.

If operating voltage is applied to the gate lines 565, 570 of the second and third transistor 518, 616, a current flows in the opposite direction in the electrically conducting connection 550. This current flows in the opposite direction through the windings of the coil 555 of the motor. The motor consequently operates in a second direction, opposite to the first direction.

To protect the motor against being inadvertently activated in the event of a short-circuit, a first coupling (not shown) is provided between the gate lines 560, 565 of the first and of the second transistor 516, 518, as described for FIG. 5. This first coupling includes a coupling resistor, as described for FIG. 5.

A second coupling (not shown) is likewise provided between the gate lines 570, 575 of the third and fourth transistor 616, 618. This second coupling likewise includes a coupling resistor.

The coupling resistors selected for each of the two couplings are sufficiently large that each transistor 516, 518, 616, 618 may be specifically controlled as long as a short-circuit is not present. The coupling resistors therefore remain in a blocking state for as long as voltage is applied that is lower than or equal to the operating voltage.

A short-circuit potential is significantly higher than the operating potential. Therefore, in the event of a short-circuit between the gate line 560 and a drain line of the first transistor 516, the first and second transistors 516, 518 are controlled by the first coupling. The same applies if a short-circuit occurs between the gate line 570 and a drain line of the second transistor 518. In the event of a short-circuit between the gate line 565 and a drain line of the third transistor 616, the third and fourth transistors 616, 618 are controlled by the second coupling. The same applies if a short-circuit occurs between the gate line 575 and a drain line of the fourth transistor 618.

This dual control of the first and second and of the third and fourth transistor reduces the difference in potential in the H-bridge circuit and thus prevents the activation of the motor.

Figure 7:
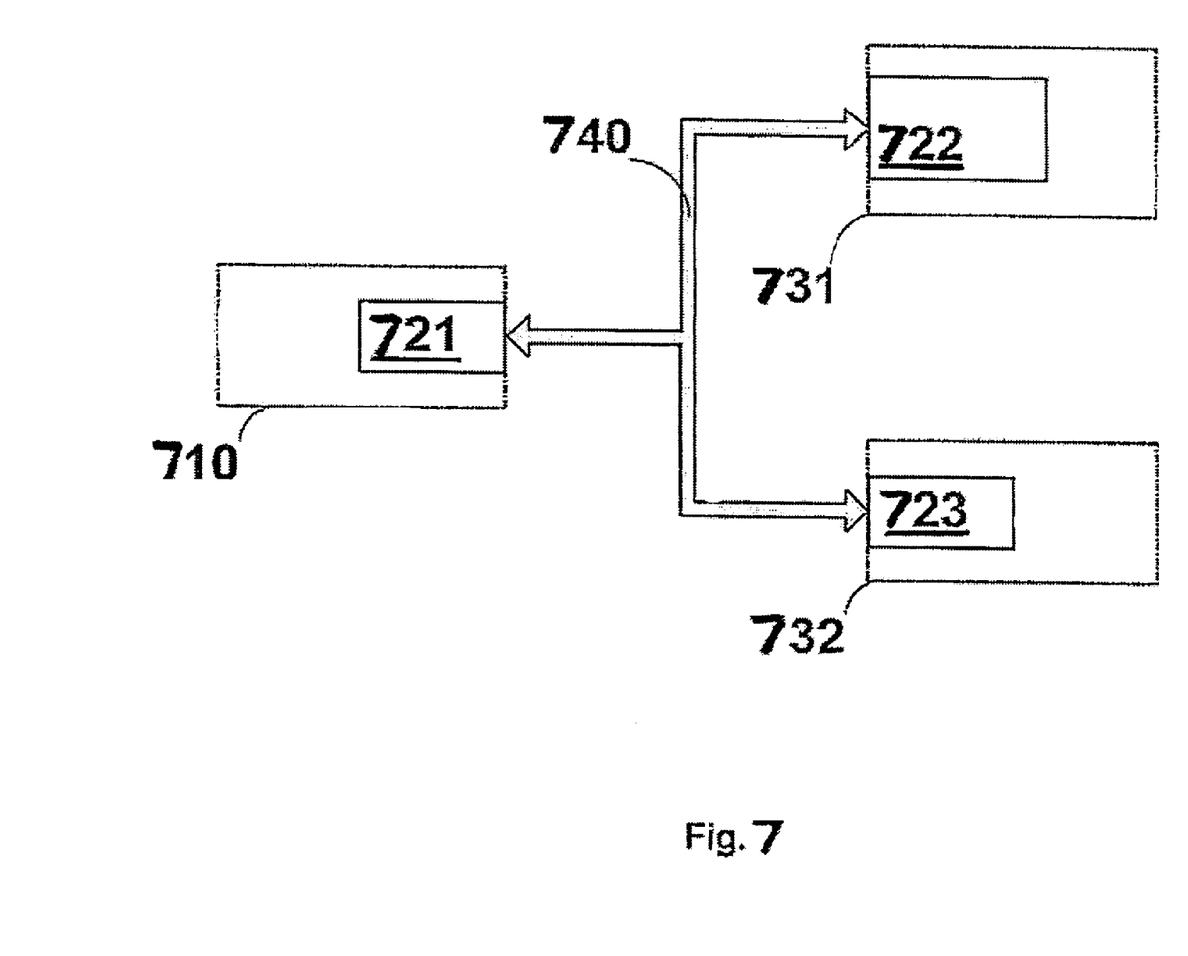
FIG. 7 shows an electronic system for operating an electromechanical parking brake system of a vehicle, which includes a protective circuit from FIG. 1.

FIG. 7 shows an electronic system for operating an electromechanical parking brake system of a vehicle, which includes a protective circuit described with reference to FIG. 1.

An electronic control component 721 is integrated in a system unit 710, which is designed in this case as an input unit for capturing a driver's wish to actuate the parking brake system.

This electronic control component 721 includes, as the so-called "master", a central computer unit which evaluates the driver's wish and determines the activation of the parking brake system. For this purpose, the electronic control component 721 interacts with other electronic control components 722 and 723, which are designated as "slaves", by exchanging data via a communication system 740, e.g. a CAN bus or a LIN bus. These electronic control components 722, 723 are integrated in positioning units 731, 732, which are assigned to the brakes of the vehicle. Because of the integration of the electronic control components 722, 723, the positioning units 731, 732 are so-called "smart" actuators.

Protective circuits (not shown) as per FIG. 1 are included in the electronic control components 722, 723 of the positioning units 731, 732.

In one variant, a protective circuit (not shown) as per FIG. 1 is likewise included in the electronic control component 721.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

The invention claimed is:

1. A protective circuit arranged on a printed circuit board comprising:
   at least one supply voltage track on the printed circuit board,
   at least one semiconductor switch with a plurality of terminals on the printed circuit board, an
   at least one control component with at least one terminal on the printed circuit board that is electrically connected to a first terminal of the semiconductor switch,
   a first conductor loop connected to an electronic evaluation unit, the first conductor loop arranged on the printed circuit board so that it surrounds an electrically conducting connection between the supply voltage track and the control component, and
   a second conductor loop, which is arranged on the printed circuit board so that it screens the electrically conducting connection between the first terminal of the control component and the first terminal of the semiconductor switch from the semiconductor switch, and at least from those regions of the control component which are also connected to the supply voltage track, the second conductor loop also completely surrounding the first terminal of the control component and the first terminal of the of the semiconductor switch.

2. The protective circuit according to claim 1, wherein the at least one semiconductor switch controls a downstream component, and further wherein, if activation of the downstream component is triggered by a short-circuit, a voltage UM applied to the downstream component is determined at least by a threshold voltage UTh of the at least one semiconductor switch and an operating voltage UB applied between the supply voltage track and an earth potential, and wherein
   the threshold voltage UTh of the at least one semiconductor switch is chosen so that, if the activation of the downstream component is triggered by the short-circuit, the voltage UM applied to the downstream component is insufficient to at least one of operate or damage the component.

3. The protective circuit according to claim 2, wherein the semiconductor switch and the control component each have a second terminal, and the second terminal of the semiconductor switch and the second terminal of the control component are connected electrically to the supply voltage track.

4. The protective circuit according to claim 3, wherein the control component has a third and a fourth terminal, and the third and fourth terminals of the control component have an earth potential.

5. The protective circuit according to claim 3, wherein the control component has a third and a fourth terminal, and the first terminal of the control component is arranged between the third and fourth terminals of the control component.

6. The protective circuit according to claim 3, wherein the control component has a third and a fourth terminal, and a start of the second conductor loop is connected electrically to the third terminal of the control component, and an end of the second conductor loop is connected electrically to the fourth terminal of the control component.

7. The protective circuit according to claim 6, wherein the second conductor loop is a closed second conductor loop, because of the connection of the conductor loop to the third and fourth terminals of the control component.

8. The protective circuit according to claim 1, wherein the first and second conductor loops are bare at least in sections.

9. The protective circuit according to claim 1, wherein the semiconductor switch is a transistor, and the first terminal of the semiconductor switch is a gate terminal of the transistor.

10. The protective circuit according to claim 9, wherein at least one diode is included in the electrical connection between the first terminal of the control component and the gate terminal of the transistor, or at least one voltage divider is provided in the transistor.

11. The protective circuit according to claim 9, wherein the transistor includes a third terminal, and the third terminal is a source terminal of the transistor.

12. The protective circuit according to claim 9, wherein between the gate terminal of the transistor and the first terminal of the control component, an electrically conducting connection is formed, and the source terminal of the transistor is connected electrically to this electrically conducting connection.

13. The protective circuit according to claim 12, wherein the electrically conducting connection between the source terminal of the transistor and the electrically conducting connection between the gate terminal of the transistor and the first terminal of the control component includes at least one discharge resistor.

14. The protective circuit according to claim 9, wherein the electrically conducting connection between the gate terminal of the transistor and the first terminal of the control component includes at least one discharge resistor.

15. Protective circuit according to claim 9, wherein at least one diode is included in the electrical connection between the first terminal of the control component and the gate terminal of the transistor, or at least one voltage divider is provided in the transistor.

16. The protective circuit according to claim 1, wherein
at least two transistors are included on the printed circuit board,
the control component has at least one fifth terminal,
the first and fifth terminals of the control component are arranged between the third and fourth terminals, and
in each case between two electrical connections, which are formed between a gate terminal of a first transistor and a first terminal of the control component and between a gate terminal of a second transistor and a fifth terminal of the control component, an electrically conducting coupling is formed.

17. The protective circuit according to claim 16, wherein the electrically conducting coupling includes at least one coupling resistor.

18. The protective circuit according to claim 1, wherein the second conduction loop screens the electrically conducting connections which are formed between a gate terminal of a transistor and a terminal of the control component from the transistor, and at least from those regions of the control component which are connected to the supply voltage track.

19. The protective circuit according to claim 1 wherein the circuit includes two adjacent printed circuit boards with each of the circuit boards including
at least one supply voltage track,
at least one semiconductor switch, and
at least one control component being arranged,
a first of the two printed circuit boards being arranged over a second printed circuit board, with:
the first and second printed circuit boards being connected to each other by at least one of mechanically and electrically,
and further wherein a protective surface that is characterized by a conductor surface is arranged between the first and second printed circuit boards and screens the first and second printed circuit boards from each other.

20. The protective circuit according to claim 19, wherein the printed circuit boards include the conductor surface having earth potential.

21. The protective circuit according to claim 1 wherein the protective circuit is included in an electronic system for operating an electromechanical parking brake system of a vehicle, the electronic system including:
at least one input unit to capture a driver's wish, which is evaluated by a control unit which controls at least one positioning unit to actuate at least one brake, the control unit including at least two control components, of which a first control component is assigned to the input unit, and at least one second control component is assigned to the at least one positioning unit.

22. The protective circuit according to according to claim 21, wherein the protective circuit according to is included in at least one of the control components.

23. The protective circuit according to claim 21, wherein the at least one second control component is integrated in the at least one positioning unit, and includes at least one protective circuit.

24. The protective circuit according to claim 1 wherein the protective circuit is included in an electronic system for operating an electromechanical parking brake system of a vehicle that includes at least one input unit to capture a driver's wish, which is evaluated by a control unit which controls at least one positioning unit to actuate at least one brake, the control unit including at least two control components, of which a first control component is assigned to the input unit, and at least one second control component is assigned to the at least one positioning unit.

25. The protective circuit according to claim 24, wherein the protective circuit is included in at least one of the control components and includes two adjacent printed circuit boards with each of the circuit boards including:
at least one supply voltage track,
at least one semiconductor switch, and
at least one control component being arranged,
a first of the two printed circuit boards being arranged over a second printed circuit board,
the first and second printed circuit boards being connected to each other at least one of mechanically and electrically, and
further wherein a protective surface that is characterized by a conductor surface is arranged between the first and second printed circuit boards and screens the first and second printed circuit boards from each other,
and further wherein the protective circuit is included in at least one of the control components.

26. The protective circuit according to claim 24, wherein the at least one second control component is integrated in the at least one positioning unit, and the protective circuit includes two adjacent printed circuit boards with each of the circuit boards including:
at least one supply voltage track,
at least one semiconductor switch, and
at least one control component being arranged,
a first of the two printed circuit boards being arranged over a second printed circuit board,
the first and second printed circuit boards being connected to each other at least one of mechanically and electrically, and
further wherein a protective surface that is characterized by a conductor surface is arranged between the first and second printed circuit boards and screens the first and second printed circuit boards from each other.

* * * * *